US012757721B2

(12) United States Patent
Chen et al.

(10) Patent No.: US 12,757,721 B2
(45) Date of Patent: Oct. 6, 2026

(54) BARRIER LAYERS FOR INTERCONNECTS IN BONDED WAFERS

(71) Applicant: UNITED MICROELECTRONICS CORP., Hsin-Chu City (TW)

(72) Inventors: Yu-Chun Chen, Kaohsiung City (TW); Yu-Ping Wang, Hsinchu City (TW); I-Ming Tseng, Kaohsiung City (TW); Yi-An Shih, Changhua County (TW); Chung-Sung Chiang, Kaohsiung City (TW); Chiu-Jung Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 492 days.

(21) Appl. No.: 18/203,655

(22) Filed: May 31, 2023

(65) Prior Publication Data

US 2024/0371758 A1 Nov. 7, 2024

(30) Foreign Application Priority Data

May 2, 2023 (TW) ................................. 112116248

(51) Int. Cl.

| | |
|---|---|
| ***H10W 20/41*** | (2026.01) |
| ***H10W 20/00*** | (2026.01) |
| ***H10W 20/20*** | (2026.01) |
| ***H10W 20/42*** | (2026.01) |
| ***H10W 20/43*** | (2026.01) |

(Continued)

(52) U.S. Cl.

CPC ....... *H10W 20/435* (2026.01); *H10W 20/023* (2026.01); *H10W 20/2134* (2026.01); *H10W 20/215* (2026.01); *H10W 20/42* (2026.01); *H10W 20/425* (2026.01); *H10W 20/47* (2026.01); *H10W 20/0242* (2026.01); *H10W 80/312* (2026.01); *H10W 80/327* (2026.01);

(Continued)

(58) Field of Classification Search

CPC ......... H01L 21/76852; H01L 21/76843; H01L 21/76846; H01L 21/76898; H01L 23/481; H01L 2224/80894–80896; H01L 25/06541; H10W 20/033; H10W 20/706; H10W 20/425; H10W 20/455; H10W 90/297; H10W 20/2134; H10W 20/215

See application file for complete search history.

(56) References Cited

U.S. PATENT DOCUMENTS 6,083,842 A * 7/2000 Cheung ............ H01L 21/76852 438/785
6,995,475 B2 2/2006 Biggs (Continued)

FOREIGN PATENT DOCUMENTS

CN 108288616 A 7/2018

*Primary Examiner* — Daniel Luke
(74) *Attorney, Agent, or Firm* — Winston Hsu

(57) ABSTRACT

A method for fabricating a semiconductor device includes the steps of first bonding a top wafer to a bottom wafer, in which the top wafer has a first metal interconnection including a first barrier layer exposing from a bottom surface of the top wafer. Next, a dielectric layer is formed on the bottom surface of the top wafer and then a second metal interconnection is formed in the dielectric layer and connected to the first metal interconnection, in which the second metal interconnection includes a second barrier layer and the first barrier layer and the second barrier layer include a H-shape altogether.

8 Claims, 3 Drawing Sheets

(51) Int. Cl.

| | |
|---|---|
| ***H10W 20/47*** | (2026.01) |
| ***H10W 80/00*** | (2026.01) |
| ***H10W 90/20*** | (2026.01) |
| *H10W 90/00* | (2026.01) |

(52) U.S. Cl.
CPC ........ *H10W 90/297* (2026.01); *H10W 90/792* (2026.01)

(56) References Cited

U.S. PATENT DOCUMENTS

| | | | | |
|---|---|---|---|---|
| 10,312,201 | B1 | 6/2019 | Hu | |
| 11,069,703 | B2 * | 7/2021 | Nishida | H01L 21/76877 |
| 11,094,626 | B2 * | 8/2021 | Lee | H01L 21/76877 |
| 2020/0395339 | A1 | 12/2020 | Chen | |
| 2023/0140534 | A1 * | 5/2023 | Chien | H10D 64/01 257/774 |
| 2023/0402385 | A1 * | 12/2023 | Lin | H01L 21/76849 |

* cited by examiner

BARRIER LAYERS FOR INTERCONNECTS IN BONDED WAFERS

BACKGROUND OF THE INVENTION

1. Field of the Invention

The invention relates to a method for fabricating semiconductor device, and more particularly, to a method of bonding a top wafer and a bottom wafer and then forming metal interconnections on a backside of the top wafer.

2. Description of the Prior Art

As technology advances, augmented reality (AR) and virtual reality (VR) applications also progresses rapidly and in a foreseen future, AR and VR applications will likely be applicable to our daily lives including various applications in the fields of education, logistics, medicine, and military.

Currently, AR and VR applications are commonly implemented by head-mounted displays. The head-mounted displays in most circumstances connect the display driver integrated circuits (DDICs) including high-voltage (HV) devices, medium-voltage (MV) devices, and/or low-voltage (LV) devices to a display module through extremely long wires or metal interconnections. This design is typically applied to larger scale products that not only consumes a great amount of space but also increases the difficulty for mounting the device. Hence, how to improve the current process for producing a display device suitable for both AR and VR environments has become an important task in this field.

SUMMARY OF THE INVENTION

According to an embodiment of the present invention, a method for fabricating a semiconductor device includes the steps of first bonding a top wafer to a bottom wafer, in which the top wafer has a first metal interconnection including a first barrier layer exposing from a bottom surface of the top wafer. Next, a dielectric layer is formed on the bottom surface of the top wafer and then a second metal interconnection is formed in the dielectric layer and connected to the first metal interconnection, in which the second metal interconnection includes a second barrier layer and the first barrier layer and the second barrier layer include a H-shape altogether.

According to another aspect of the present invention, a semiconductor device includes a top wafer bonded to a bottom wafer as the top wafer includes a first metal interconnection having a first barrier layer, a dielectric layer on the bottom surface of the top wafer, and a second metal interconnection in the dielectric layer and the top wafer and connected to the first metal interconnection. Preferably, the second metal interconnection includes a second barrier layer and the first barrier layer and the second barrier layer form a H-shape altogether.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
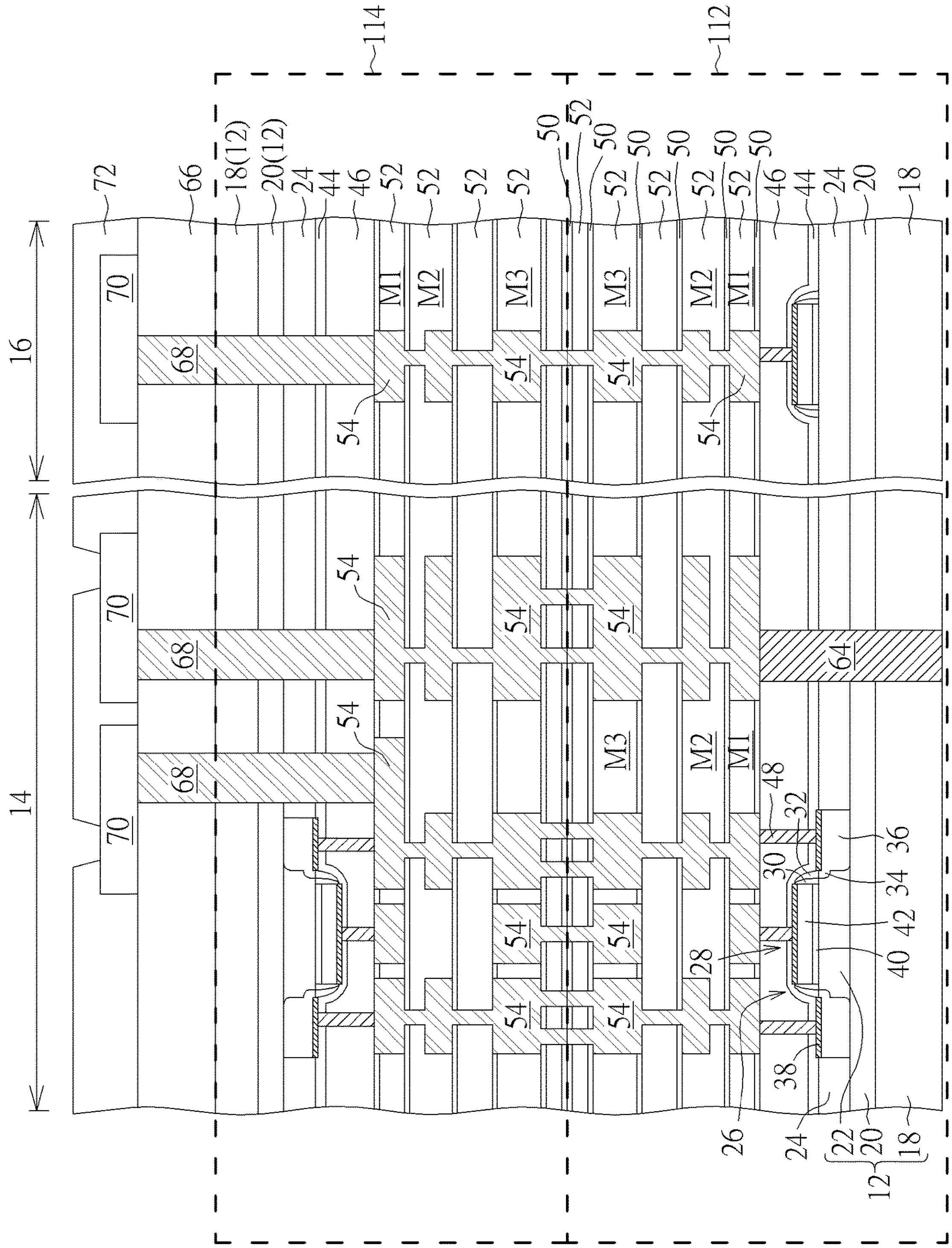
FIGS. 1-2 illustrate a method for fabricating a semiconductor device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on." "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 2:
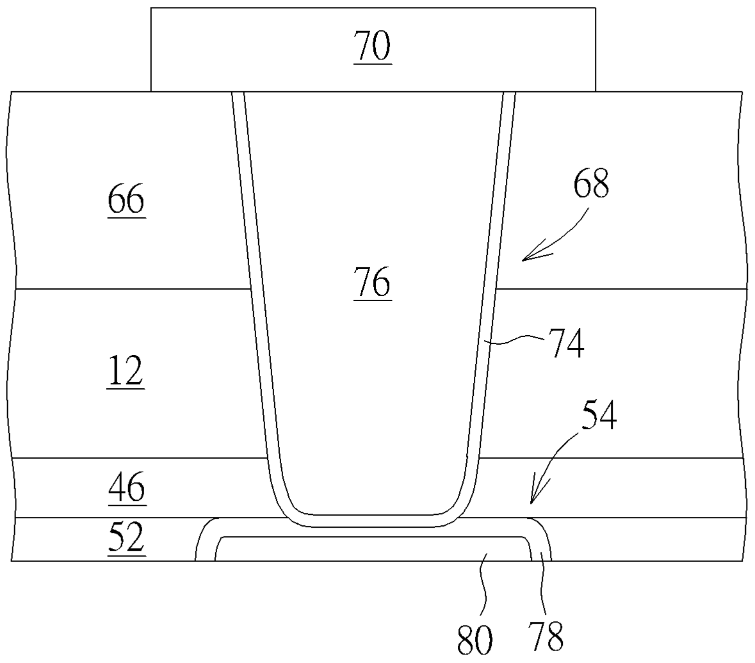

Referring to FIGS. 1-2, FIGS. 1-2 illustrate a method for fabricating a semiconductor device that could be applied to an AR or VR display device according to an embodiment of the present invention. As shown in FIG. 1, bottom wafer such as a wafer 112 and a top wafer such as a wafer 114 both made of semiconductor material are provided, in which a chip region 14 and a die seal ring region 16 are defined on the wafers 112, 114 and elements such as HV devices, MV devices, pixel circuits, LV devices for LV driving circuits and/or graphics processing units (GPU) could be formed on the wafers 112, 114 depending on the demand of the process. Preferably, each of the wafers 112, 114 include a substrate 12 made of semiconductor materials as the substrate 12 could also be made of semiconductor substrate material including but not limited to for example silicon substrate, epitaxial silicon substrate, silicon carbide substrate or even a silicon-on-insulator (SOI) substrate, which are all within the scope of the present invention.

To prepare the bottom wafer or wafer 112 for example, a substrate 12 is provided, in which the substrate 12 is preferably a silicon-on-insulator (SOI) substrate, which preferably includes a first semiconductor layer 18, an insulating layer 20 on the first semiconductor layer 18, and a second semiconductor layer 22 on the insulating layer 20. Preferably, the first semiconductor layer 18 and the second semiconductor layer 22 could be made of same material or different material and could both be made of material including but not limited to for example silicon, germanium, or silicon germanium (SiGe). The insulating layer 20 disposed between the first semiconductor layer 18 and second semiconductor layer 22 preferably includes $SiO_2$, but not limited thereto. It should be noted that even though a SOI substrate is chosen as the substrate for the semiconductor device of this embodiment, the substrate 12 could also be made of semiconductor substrate material including but not limited to for example silicon substrate, epitaxial silicon substrate, or silicon carbide substrate, which are all within the scope of the present invention.

Next, part of the second semiconductor layer 22 is removed to form a shallow trench isolation (STI) 24 around the second semiconductor layer 22, in which the second semiconductor layer 22 surrounded by the STI 24 is used for fabricating an active device. Next, at least an active device 26 is formed on the substrate 12 on the chip region 14 and the die seal ring region 16. In this embodiment, the active device 26 is an metal-oxide semiconductor (MOS) transistor, which preferably includes a gate structure 28, spacers 30 and 32 on sidewalls of the gate structure 28, a lightly doped drain (LDD) 34 in the second semiconductor layer 22 adjacent to two sides of the spacer 30, a source/drain region 36 in the second semiconductor layer 22 adjacent to two sides of the spacer 32, a selective epitaxial layer (not shown) in the second semiconductor layer 22 adjacent to two sides of the spacer 32, and a selective silicide 38 on the surface of the source/drain region 36 and the top surface of the gate structure 28.

In this embodiment, the gate structure 28 further includes a gate dielectric layer 40 and a gate material layer 42 serving as a gate electrode on the gate dielectric layer 40, in which the gate dielectric layer 40 includes silicon dioxide ($SiO_2$), silicon nitride (SiN), or high dielectric constant (high-k) material while the gate material layer 42 could include metal, polysilicon, or silicides.

Each of the spacer 30 and spacer 32 could be a single spacer made of material including but not limited to for example $SiO_2$, SiN, SiON, SiCN, or combination thereof. Nevertheless, according to an embodiment of the present invention, each of the spacers 30 and 32 could also be a composite spacer including a first sub-spacer (not shown) and a second sub-spacer (not shown), in which one of the first sub-spacer and the second sub-spacer could be L-shaped or I-shaped, the first sub-spacer and the second sub-spacer could be made of same material or different material, and both the first sub-spacer and the second sub-spacer could be made of material including but not limited to for example $SiO_2$, SIN, SION, SiCN, or combination thereof, which are all within the scope of the present invention.

Next, a contact etch stop layer (CESL) 44 preferably made of silicon nitride is formed on the substrate 12 to cover the gate structure 28, an interlayer dielectric (ILD) layer 46 is formed on the CESL 44, and contact plugs 48 are formed in the ILD layer 48 to electrically connect the gate structure 28 and the source/drain region 36. Next, a metal interconnective process could be conducted to form a plurality of metal interconnective structures on ILD layer 48 on both the chip region 14 and die seal ring region 16, in which the metal interconnective structures could include stop layer 50, inter-metal dielectric (IMD) layers 52, and metal interconnections 54 disposed in the stop layers 50 and IMD layers 52 to connect to the contact plugs 48. For instance, multiple metal interconnections 54 including a first level metal interconnection M1, a second level metal interconnection M2, and a third level metal interconnection M3 could be sequentially formed above the ILD layer 46.

It should be noted that at this stage, metal interconnections 54 are exposed from the front side or top surface of the wafer 112 for bonding to another wafer while a back side contact or metal interconnection 64 connected to the first level metal interconnection M1 is also exposed from the back side of the wafer 112.

In this embodiment, each of the metal interconnections 54, 64 could include a trench conductor or a via conductor and each of the metal interconnections 54, 64 from the metal interconnect structures could be embedded within the IMD layers 52 and/or stop layer 50 according to a single damascene process or dual damascene process. For instance, each of the metal interconnections 54, 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the IMD layers 52 could include silicon oxide or ultra low-k (ULK) dielectric layer and the stop layers 50 could include nitrogen doped carbide (NDC), silicon nitride, silicon carbon nitride (SiCN), or combination thereof.

In this embodiment, the bottom wafer and the top wafer mostly share same composition and components. Similar to the wafer 112, elements including active devices 26 are disposed on the substrate 12 made of SOI of the wafer 114, an ILD layer 46 and IMD layers 52 are disposed on the active devices 26, and metal interconnections 54 are disposed in the IMD layers 52 to connect to the active devices 26. For simplicity purpose and emphasizing the components on the back side of the top wafer in the later process, same elements in the wafers 112, 114 are labeled with same numberings while numbering of part of the elements in the wafer 114 is also omitted.

Next, the top wafer or the wafer 114 is reversed so that the front side of the wafer 114 is facing toward the front side of the wafer 112 and then the wafer 114 is bonded to the wafer 112. Preferably, the bonding of the two wafers 112, 114 could be accomplished by bonding the metal interconnections 54 in the wafers 112, 114 through a hybrid bonding process as the wafers 112, 114 are facing front side to front side with each other.

Next, a dielectric layer 66 is formed on the bottom surface of the wafer 114, a photo-etching process is conducted to remove part of the dielectric layer 66, part of the substrate 12, and part of the ILD layer 46 in the wafer 114 on both the chip region 14 and die seal ring region 16 to form deep trench openings, forming conductive materials in the deep trench openings accompanied by a planarizing process to form deep via conductors or metal interconnections 68 in the dielectric layer 66 and connected to the metal interconnections 54 or more specifically first level metal interconnections M1 in the wafer 114. Next, contact plugs 70 could be formed on the metal interconnections 68 and a passivation layer 72 is formed on the dielectric layer 66 to expose the contact pads 70. In this embodiment, the dielectric layer 66 preferably includes silicon nitride, the metal interconnections 64, 68 include copper, the contact pads 70 include aluminum, and the passivation layer 72 could include silicon oxide or silicon nitride, but not limited thereto.

Figure 3:
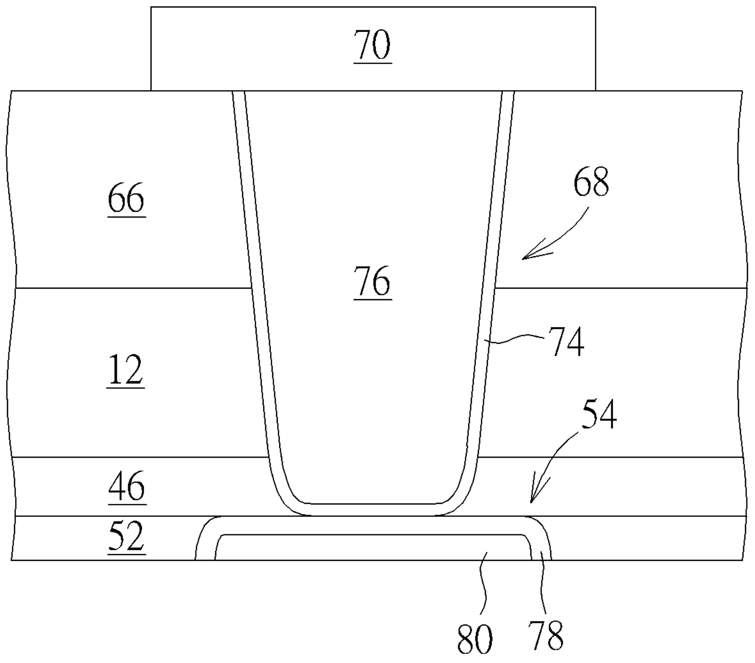
FIG. 3 illustrates a structural view of a semiconductor device according to an embodiment of the present invention.
Figure 4:
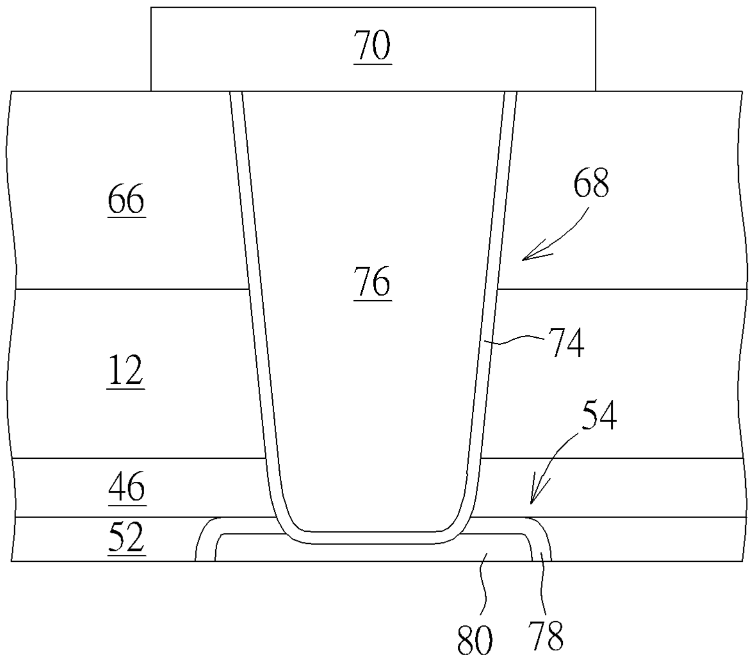
FIG. 4 illustrates a structural view of a semiconductor device according to an embodiment of the present invention.

Referring to FIGS. 2-4, FIGS. 2-4 illustrate enlarged views of a deep via conductor or metal interconnection 68 and a metal interconnection 54 in the wafer 114. As shown in FIG. 2, the metal interconnection 68 includes a barrier layer 74 and a metal layer 76 disposed on the barrier layer 74 and the metal interconnection 54 also includes a barrier layer 78 and a metal layer 80 disposed on the barrier layer 78. Preferably, the barrier layers 74, 78 could be selected from the group consisting of titanium (Ti), titanium nitride (TiN), tantalum (Ta), and tantalum nitride (TaN) and the metal layers 76, 80 could be selected from the group consisting of tungsten (W), copper (Cu), aluminum (Al), titanium aluminide (TiAl), and cobalt tungsten phosphide (CoWP).

Specifically, the barrier layer 78 in the metal interconnection 54 includes a reverse U-shape, the barrier layer 74 in the metal interconnection 68 includes a U-shape, the bottom surface of the barrier layer 74 is less than the bottom surface of the barrier layer 78 or the width of the barrier layer 74 is less than the width of the barrier layer 78, and the barrier layer 74 and the barrier layer 78 altogether constitute a H-shape. In this embodiment, the height of the deep via conductor or metal interconnection 68 is greater than once the height of the metal interconnection 54. For instance, the height of the metal interconnection 68 could be greater than two times, three times, four times, or even five times the height of the metal interconnection 54. Accordingly, the height of the barrier layer 74 within the metal interconnection 68 is also greater than once the height of the barrier layer 78 in the metal interconnection 54. For instance, the height of the barrier layer 74 could be greater than two times, three times, four times, or even five times the height of the barrier layer 78. Moreover, the width of the metal interconnection 54 is greater than the width of the metal interconnection 68. For instance, the width of the metal interconnection 54 could be greater than 10%, 20%, 30%, 40%, 50%, 60%, 70%, 80%, 90%, 100%, or even more than 100% of the width of the metal interconnection 68.

Furthermore, as shown in FIG. 2, the bottom surface of the barrier layer 78 in the metal interconnection 54 is even with the bottom surface (or the surface between the layers 46 and 52) of the IMD layer 52 while the bottom surface of the barrier layer 74 in the metal interconnection 68 is slightly lower than the bottom surface of the same IMD layer 52 such that part of the U-shape barrier layer 74 is inserted into the reverse U-shape barrier layer 78. Viewing from another perspective, the bottom surface of the metal interconnection 68 is inserted downward into the metal interconnection 54 so that the bottom surfaces of the two metal interconnections 54, 68 are not even with each other.

Nevertheless, as shown in FIG. 3, according to an embodiment of the present invention, the bottom surface of the barrier layer 78 in the metal interconnection 54 could be even with the bottom surface of the IMD layer 52 while the bottom surface of the barrier layer 74 in the metal interconnection 68 is also even with the bottom surface of the same IMD layer 52 such that the bottom surface of the U-shape barrier layer 74 and the bottom surface of the reverse U-shape barrier layer 78 are both even with the surface of the IMD layer 52 at the same time.

Next, as shown in FIG. 4, in contrast to the bottom surface of the metal interconnection 68 is inserted into part of the metal interconnection 54 while the barrier layer 78 in the metal interconnection 54 still contacts the bottom surface of the metal interconnection 68 as shown in FIG. 2, according to yet another embodiment of the present invention, the metal interconnection 68 could be inserted downward to separate the barrier layer 78 in the metal interconnection 54 into two portions on left and right. In other words, the bottom surface of the barrier layer 74 in the metal interconnection 68 preferably contacts the metal layer 80 directly while sidewalls of the barrier layer 74 contact the barrier layers 78 directly, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

bonding a top wafer to a bottom wafer, wherein the top wafer comprises a first metal interconnection comprising a first barrier layer, an interlayer dielectric layer and an inter-metal dielectric layer, wherein an interface is present between the inter-metal dielectric layer and the interlayer dielectric layer, and a bottom surface of the first barrier layer is even with the interface;

forming a dielectric layer on a bottom surface of the top wafer; and forming a second metal interconnection in the dielectric layer and the top wafer and connected to the first metal interconnection, wherein the second metal interconnection comprises a second barrier layer.

2. The method of claim 1, wherein the first barrier layer comprises a reverse U-shape.

3. The method of claim 1, wherein the second barrier layer comprises a U-shape.

4. The method of claim 1, wherein the second barrier layer is inserted into the first barrier layer.

5. A semiconductor device, comprising:

a top wafer bonded to a bottom wafer, wherein the top wafer comprises a first metal interconnection comprising a first barrier layer, an interlayer dielectric layer and an inter-metal dielectric layer, wherein an interface is present between the inter-metal dielectric layer and the interlayer dielectric layer, and a bottom surface of the first barrier layer is even with the interface;

a dielectric layer on a bottom surface of the top wafer; and a second metal interconnection in the dielectric layer and the top wafer and connected to the first metal interconnection, wherein the second metal interconnection comprises a second barrier layer.

6. The semiconductor device of claim 5, wherein the first barrier layer comprises a reverse U-shape.

7. The semiconductor device of claim 5, wherein the second barrier layer comprises a U-shape.

8. The semiconductor device of claim 5, wherein the second barrier layer is inserted into the first barrier layer.

* * * * *